(12) United States Patent
Long et al.

(10) Patent No.: US 9,859,320 B2
(45) Date of Patent: Jan. 2, 2018

(54) CHIP PACKAGE AND MANUFACTURING METHOD THEREOF

(71) Applicant: XINTEC INC., Taoyuan (TW)

(72) Inventors: Shun-Wen Long, Taoyuan (TW);
Guo-Jyun Chiou, Taoyuan (TW);
Meng-Han Kuo, Taipei (TW);
Ming-Chieh Huang, Kaohsiung (TW);
Hsi-Chien Lin, Zhubei (TW);
Chin-Kang Chen, Taoyuan (TW);
Yi-Pin Chen, Zhubei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/393,006

(22) Filed: Dec. 28, 2016

(65) Prior Publication Data

US 2017/0186797 A1 Jun. 29, 2017

Related U.S. Application Data

(60) Provisional application No. 62/272,603, filed on Dec. 29, 2015.

(51) Int. Cl.
*H01L 27/14* (2006.01)
*H01L 27/146* (2006.01)

(52) U.S. Cl.
CPC .. *H01L 27/14629* (2013.01); *H01L 27/14623* (2013.01); *H01L 27/14636* (2013.01); *H01L 27/14698* (2013.01); *H01L 27/14685* (2013.01)

(58) Field of Classification Search
CPC ......... H01L 27/14629; H01L 27/14698; H01L 27/14623; H01L 27/14636; H01L 27/14685
See application file for complete search history.

(56) References Cited

U.S. PATENT DOCUMENTS

2013/0214375 A1* 8/2013 Dai .................. H01L 27/14618
257/459

* cited by examiner

*Primary Examiner* — Roy Potter
*Assistant Examiner* — Paul Patton
(74) *Attorney, Agent, or Firm* — Liu & Liu

(57) ABSTRACT

A chip package includes a chip, an insulating layer and a conductive layer. The chip includes a substrate, an epitaxy layer, a device region and a conductive pad. The epitaxy layer is disposed on the substrate, and the device region and the conductive pad are disposed on the epitaxy layer. The conductive pad is at a side of the device region and connected to the device region. The conductive pad protrudes out of a side surface of the epitaxy layer. The insulating layer is disposed below the substrate and extended to cover the side surface of the epitaxy layer. The conductive layer is disposed below the insulating layer and extended to contact the conductive pad. The conductive layer and the side surface of the epitaxy layer are separated by a first distance.

20 Claims, 13 Drawing Sheets

CHIP PACKAGE AND MANUFACTURING METHOD THEREOF

RELATED APPLICATIONS

This application claims priority to U.S. provisional Application Ser. No. 62/272,603, filed Dec. 29, 2015, which is herein incorporated by reference.

BACKGROUND

Field of Invention

The present invention relates to a chip package and a method of manufacturing the same.

Description of Related Art

With the requirement for small size, light weight, and multiple functions of electronic devices, the semiconductor chips in the electronic devices need a reduced size and an increased wiring density. Therefore, it becomes more difficult and challenging to fabricate a semiconductor chip package in the manufacturing process for the semiconductor chips. Wafer-level chip package is a method for packaging the semiconductor chips, in which after completing the manufacture of all chips on the wafer, these chips are packaged and tested on the wafer, and followed by a cutting process to form a number of individual chip packages.

Since the size of the semiconductor chip is reduced and the wiring density is increased, the usage of epitaxy layers in the chip not only shortens the time of charge collection but further increase the overall efficiency of the chip package. However, it probably occurs an incorrect electrical connection between the conductive epitaxy layer and a conductive layer subsequently formed by a wire-bonding process, thereby unfavorably forming a short circuit in the chip package and decreasing the yield of the chip package. Accordingly, related industry urgently needs an improved chip package structure and manufacturing method to prevent the problem discussed above.

SUMMARY

Thus, the present disclosure provides a chip package and manufacturing method thereof so as to enhance the insulating property between an epitaxy layer and a conductive layer.

According to one aspect of the present disclosure, a chip package is provided. The chip package includes a chip, an insulating layer, and a conductive layer. The chip includes a substrate, an epitaxy layer, a device region, and a conductive layer, in which the epitaxy layer is positioned above the substrate, the device region is positioned over the epitaxy layer, and the conductive pad is positioned at a side of the device region and connected to the device region, and the conductive pad protrudes out of a side surface of the epitaxy layer. The insulating layer is disposed below the substrate and extended to cover the side surface of the epitaxy layer. The conductive layer disposed below the insulating layer and extended to contact the conductive pad, wherein the conductive layer and the side surface of the epitaxy layer are separated by a first distance.

According to one or more embodiments of the present disclosure, the first distance is greater than 6 micrometers.

According to one or more embodiments of the present disclosure, the first distance is between 6 and 10 micrometers.

According to one or more embodiments of the present disclosure, the thickness of the epitaxy layer is between 4 and 8 micrometers.

According to one or more embodiments of the present disclosure, the chip further includes a reflection layer disposed between the substrate and the epitaxy layer.

According to one or more embodiments of the present disclosure, wherein the conductive layer and the side surface of the reflective layer are separated by a second distance, and the first distance is greater than or equal to the second distance.

According to one or more embodiments of the present disclosure, a thickness of the reflection layer is between 1 and 2 micrometers.

According to one or more embodiments of the present disclosure, the chip package of claim 1 further includes a protective layer covering the conductive layer and having an opening exposing the conductive layer. Further, an external conductive structure is disposed in the opening and in contact with the conductive layer.

According to one or more embodiments of the present disclosure, the chip further includes a sensing device positioned above the device region.

According to one or more embodiments of the present disclosure, the chip package further includes a spacer surrounding the sensing device and a transparent substrate disposed on the spacer and covering the sensing device.

According to one aspect of the present disclosure, method of manufacturing a chip package is provided. The method includes the steps described below. A wafer is provided. The wafer includes a substrate, an epitaxy layer, and a device region and a conductive pad, in which the epitaxy layer is positioned above the substrate, the device region is positioned over the epitaxy layer, and the conductive pad is positioned at a side of the device region and connected to the device region. Subsequently, the substrate is patterned, and then a portion of the epitaxy layer is removed by using the patterned substrate as a mask such that the conductive pad protrudes out of a side surface of the epitaxy layer. An insulating layer is formed below the substrate, and the insulating layer is extended to cover the side surface of the epitaxy layer and the conductive pad. Additionally, a notch is formed in the insulating layer to expose the conductive pad. Further, a conductive layer is formed below the insulating layer, and the conductive layer extends to the notch and contacts the conductive pad.

According to one or more embodiments of the present disclosure, the wafer further includes a reflection layer positioned between the substrate and the epitaxy layer.

According to one or more embodiments of the present disclosure, the step of removing the portion of the epitaxy layer further includes removing a portion of the reflection layer to expose a side surface of the reflection layer.

According to one or more embodiments of the present disclosure, the insulating layer is further extended to cover the side surface of the reflection layer.

According to one or more embodiments of the present disclosure, the method of manufacturing the chip package further includes laterally etching the side surface of the epitaxy layer, before forming the insulating layer below the substrate and extending to cover the side surface of the epitaxy layer and the conductive pad.

According to one or more embodiments of the present disclosure, the wafer further includes a sensing device on the device region.

According to one or more embodiments of the present disclosure, the method of manufacturing the chip package further includes forming a spacer surrounding the sensing device, and then forming a transparent substrate above the spacer and covering the sensing device.

According to one or more embodiments of the present disclosure, the method of manufacturing the chip package further includes forming a protective layer below the conductive layer, and forming an opening in the protective layer to expose the conductive layer.

According to one or more embodiments of the present disclosure, the method of manufacturing the chip package further includes forming an external conductive structure in the opening to contact the conductive layer.

According to one or more embodiments of the present disclosure, the method of manufacturing the chip package further includes the step described below. The protective layer, the conductive layer, the spacer and the transparent substrate is diced along the notch to form a chip package.

DETAILED DESCRIPTION

Figure 1A:
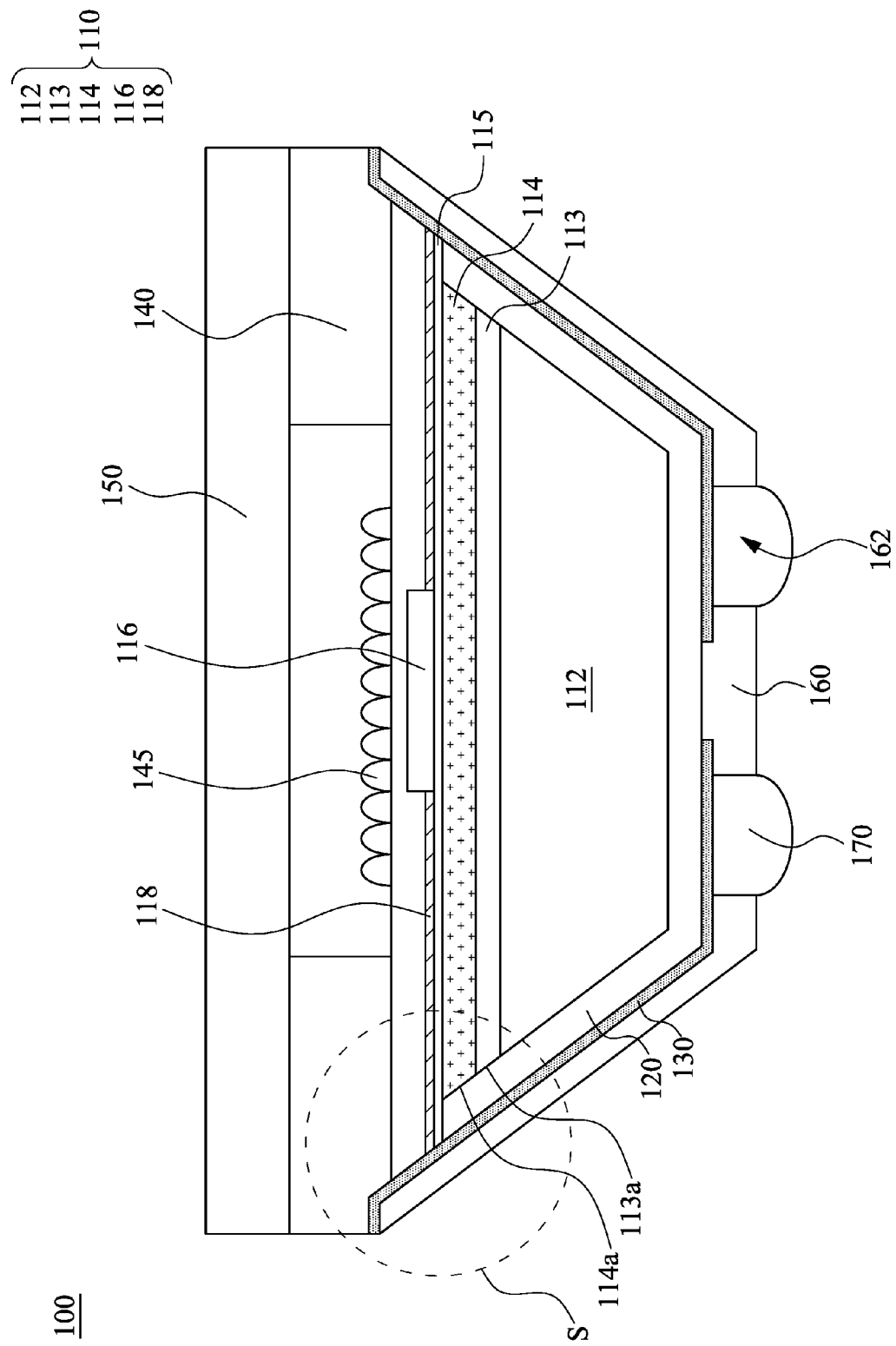
FIG. 1A illustrates a cross-sectional view of a chip package, in accordance with some embodiments of the present disclosure.

Numerous embodiments of the invention will now be disclosed, by way of illustration, and many practical details will be set forth in part in the following description for clarity of illustration. It should be understood, however, that these practical details should not be used to limit the invention. That is, these practical details are not necessary in some embodiments of the present invention. In addition, for the sake of simplicity of the drawings, some conventional structures and elements will be schematically illustrated in the drawings.

Further, spatially relative terms, such as "beneath", "below", "lower", "above," "upper", and the like, are used to describe the relationship of an element shown in the drawings to another element. It should be understood that the spatially relative terms are intended to encompass different orientations of the device in addition to the orientation depicted in the figures. For example, if a device in a figure is turned over, elements originally described as being located "below" the other elements will be oriented "above" other elements. Illustrative term "below" may include both the "above" and "below" orientations according to the particular orientation of the figures. Likewise, if a device in a figure is turned over, elements originally described as being located "below" or "lower" the other elements will be oriented "above" other elements. Illustrative terms "beneath" and "lower" may include both the "above" and "below" orientations according to the particular orientation of the figures.

FIG. 1A illustrates a cross-sectional view of a chip package 100, in accordance with some embodiments of the present disclosure. As shown in FIG. 1A, the chip package 100 includes a chip 110, an insulating layer 120, and a conductive layer 130. The chip 110 includes a substrate 112, an epitaxy layer 114, a device region 116 and a conductive pad 118. The epitaxy layer 114 is disposed on the substrate 112, and the device region 116 and the conductive pad 118 are disposed on the epitaxy layer 114. In addition, the conductive pad 118 is disposed at a side of the device region 116 and in contact with the device region 116. Specifically, the device region 116 has a semiconductor device. The chip 110 may optionally include an inter-layer dielectric layer (ILD), an inter-metal dielectric layer (IMD) 115, a passivation layer, and an interconnect metal structure, in which one or more metal layers of the interconnect metal structure extends from an interior of the device region 116 to a position out of the device region 116 to serve as the conductive pad 118 of the chip package 100, and electrically connect to the semiconductor device of the device region 116. In addition, the inter-metal dielectric layer 115 laterally extends from the interior of device region 116 to a position out of the device region 116, such that at least a portion of the inter-metal dielectric layer 115 is positioned between the epitaxy layer 114 and the conductive pad 118.

In some embodiments, the substrate 112 is a blank substrate without any device. The materials of the substrate 112 may include, but not limited to, silicon or other semiconductor elements, such as germanium or elements of group III-V. In some embodiments, the thickness of the epitaxy layer 114 is between 4 and 8 micrometer, and the crystallinity of the epitaxy layer 114 is greater than the substrate 112. The materials of the epitaxy layer 114 may include, but not limited to, epitaxial silicon, epitaxial germanium or other epitaxial elements of group III-VI. In some embodiments, some impurities can be doped in the epitaxy layer 114 to form an N-type epitaxy layer. The charges in the N-type epitaxy layer is transported by electrons which have a faster transporting speed, as compared with holes, and therefore the charge collection time can be shortened, leading to the chip package 100 with a faster responding speed.

The chip package 100 further comprising a spacer 140, a sensing device 145 and a transparent substrate 150. The sensing device 145 is disposed on the device region 116 and substantially corresponds to the device region 116. The sensing device 145 can detective incident light and generate digital signals. The device region 116 of the chip performs an operational process on the signals, and outputs the operational results to an external device through the conductive pad 112. The spacer 140 is disposed on the device region 116 and surrounds the sensing device 145. The transparent layer 150 is positioned on the spacer 140 and covers the sensing device 145. The transparent layer 150 allows light to pass there through. The spacer 140 makes the transparent layer 150 being spaced apart from the sensing device 145 by a spacing interval. The spacer 140 and the transparent layer 150, collectively forming a cavity, to protect the sensing device 145. In some embodiments, the sensing device 145 includes a plurality of microlens. The spacer 140 includes suitable insulating material, such as epoxy resin, and examples of the materials of the transparent layer 150 include glass or other suitable transparent materials.

In some embodiments of the present disclosure, the chip further includes a reflection layer 113 interposed between the substrate 112 and the epitaxy layer 114. The light passing through the transparent layer 150 but not transmitting into the sensing device 145 are reflected once again by the refection layer 113, and then arrives the sensing device 145. Therefore, the transform of incident light signals into digital signals becomes more efficient. In other embodiments, thickness of the reflection layer 113 is ranged between 1 and 2 micrometer, and the material of the reflection layer 113 includes silicon dioxide.

As shown in FIG. 1A, the conductive pad 118 is protruded out of a side surface 114a of the epitaxy layer 114. The insulating layer 120 is positioned below the substrate 112 and extends to cover the side surface 114a of the epitaxy layer 114. The conductive layer 130 is positioned below the insulating layer 120 and extends to contact the conductive pad 118, but the conductive layer 130 dose not contact the side surface 114a of the epitaxy layer 114. Referring simultaneously to FIG. 1B, FIG. 1B illustrates an enlarge view of a region S of FIG. 1A, in accordance with some other embodiments of the present disclosure. In FIG. 1B, the conductive layer 130 and the side surface of the epitaxy layer 114 are separated by a first distance D1. Although the epitaxy layer 114 can enhance operational efficiency of the chip package 100, when external current signals are transmitted through the conductive layer 130 to the epitaxy layer 114, an incorrect electrical connection occurs and that leads to short circuit in the chip package 100. In order to avoid aforementioned situation, the conductive layer 130 and the epitaxy layer 114 are separated by the first distance D1 in this disclosure, but the insulating layer 120 is interposed there between so as to secure the electrical insulation between the conductive layer 130 and epitaxy layer 114. Accordingly, the current signals are input to or output from the conductive layer 130 only through the conductive pad 118, and therefore the yield of the chip package 100 may be increased. It is noted that a suitable first distance D1 should be arranged between the conductive layer 130 and the epitaxy layer 114. When the first distance D1 is too short, the insulating effect is not sufficient. In contrast, when the first distance D1 is too large, it decreases the efficiency of charge collection time associated with the epitaxy layer 114. In some embodiments, the first distance D1 is greater than 6 micrometers, and specifically between 6 micrometers and 10 micrometers.

In some embodiments, examples of the material of the insulating layer 120 include polymeric material, which has fluidity before being cured. In some embodiments, the polymeric material of the insulating layer 120 is epoxy, preferably a photosensitive epoxy. In some embodiments, examples the material of the conductive layer 160 includes aluminum, copper, nickel, and any other suitable conductive materials.

Referring to FIG. 1A and FIG. 1B continuously, the reflection layer 113 in the chip 110 also has small conductivity. Similarly, in order to avoid incorrect electrical connections, the side surface 113a of the reflective layer 113 and the conductive layer 130 are separated by a second distance D2, and the insulating layer 120 is disposed between the conductive layer 130 and the reflective layer 113 so as to electrically insulate the reflective layer 113 from the conductive layer 130. In the embodiments of FIG. 1B, the side surface 114a of the epitaxy layer 114 and the side surface 113a of the reflective layer 113 are substantially coplanar, and that makes the first distance D1 equals the second distance D2, but the present disclosure is not limited thereto.

Figure 1C:
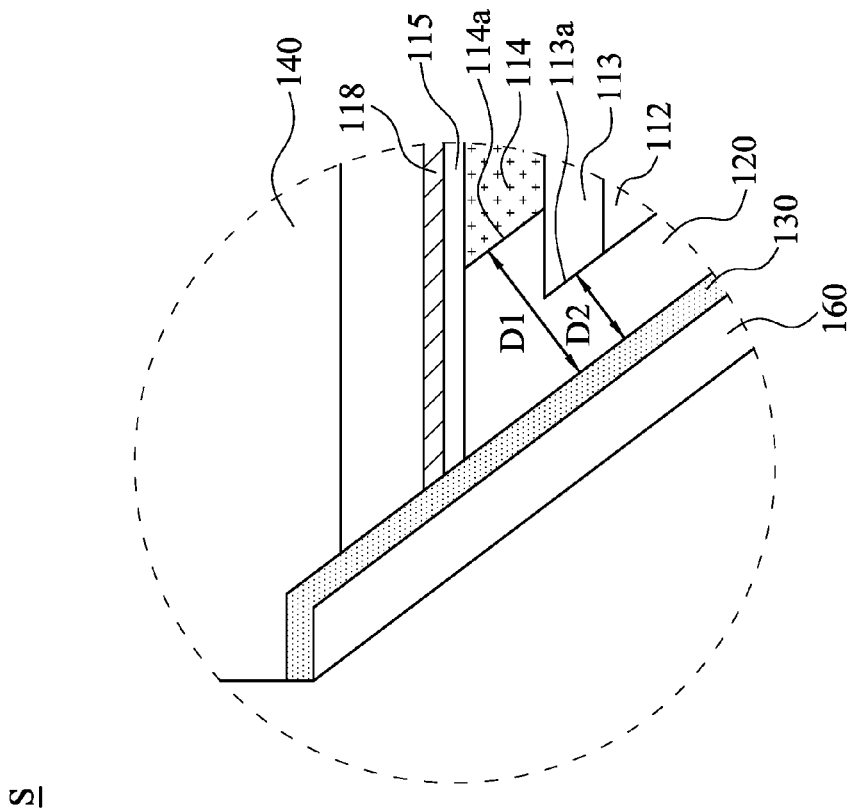
FIG. 1C is a enlarge view illustrating a region S in FIG. 1A, in accordance with some embodiments of the present disclosure.
Figure 1B:
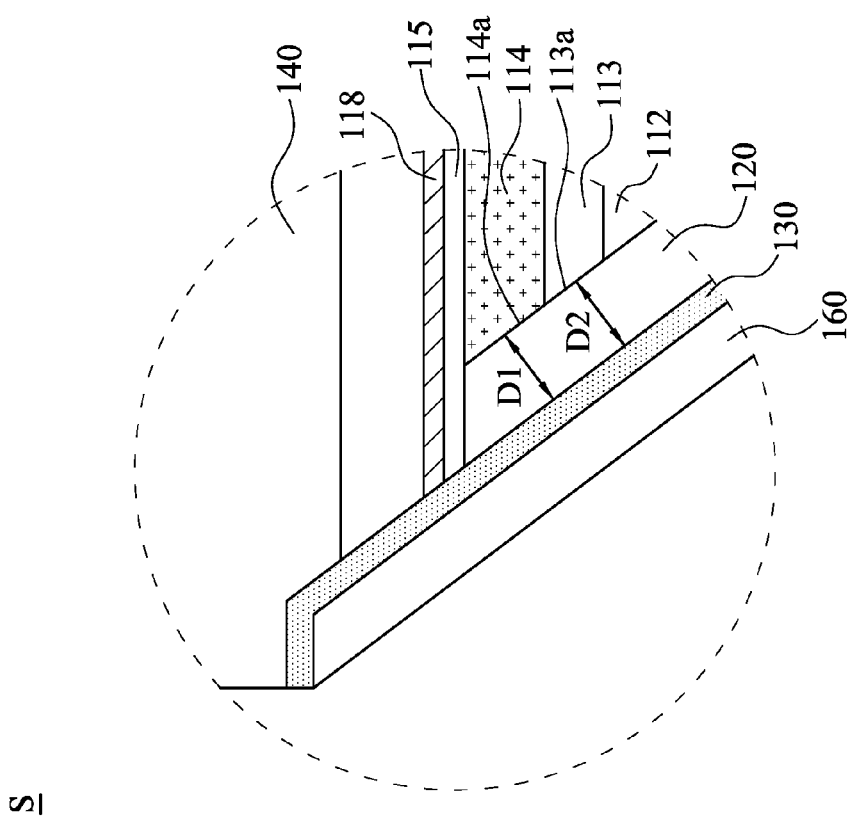
FIG. 1B illustrates a partial enlarge view of a region S of FIG. 1A, in accordance with some other embodiments of the present disclosure.

FIG. 1C illustrates an enlarged view of region S in FIG. 1A in accordance with another embodiment of the present disclosure. In the embodiments shown FIG. 1C, the side surface 114a of the epitaxy layer 114 is recessed with respect to the side surface 113a of the reflection layer 113. In the condition that the side surface 114a of the epitaxy layer 114 is recessed, the first distance D1 between the conductive layer 130 and the side surface 114a can be further increased such that the first distance D1 is greater than the second distance D2. As mentioned above, the polymeric material of the insulating layer 120 have fluidity before being cured, and it may flow into and fill the recess of the epitaxy layer 114.

The chip package further comprises a protective layer 160 and an external conductive structure 170. The protective layer 160 is disposed below the conductive layer 130 to prevent external moisture from eroding the conductive layer 130, and the protective layer 160 has an opening 162 to expose the conductive layer 130. The external conductive structure 170 is disposed in the opening 162 and in contact with the conductive layer 130. Accordingly, the external conductive structure 170 is electrically connected to the device region 116 through the conductive layer 130 and the conductive pad 118, so that it operational signals may be transmitted to an external device, such as a printed circuit board. Alternatively, current signal provided by an external device may be transmitted to the device region 116 through the same passage. In some embodiments, the material of the protective layer 160 includes epoxy, such as photosensitive epoxy. The external conductive structure 170 is a solder ball, a bump, or other structures known in the art, and the external conductive connection may be spherical, oval, square or rectangular in shape, but not limited thereto.

Figure 2:
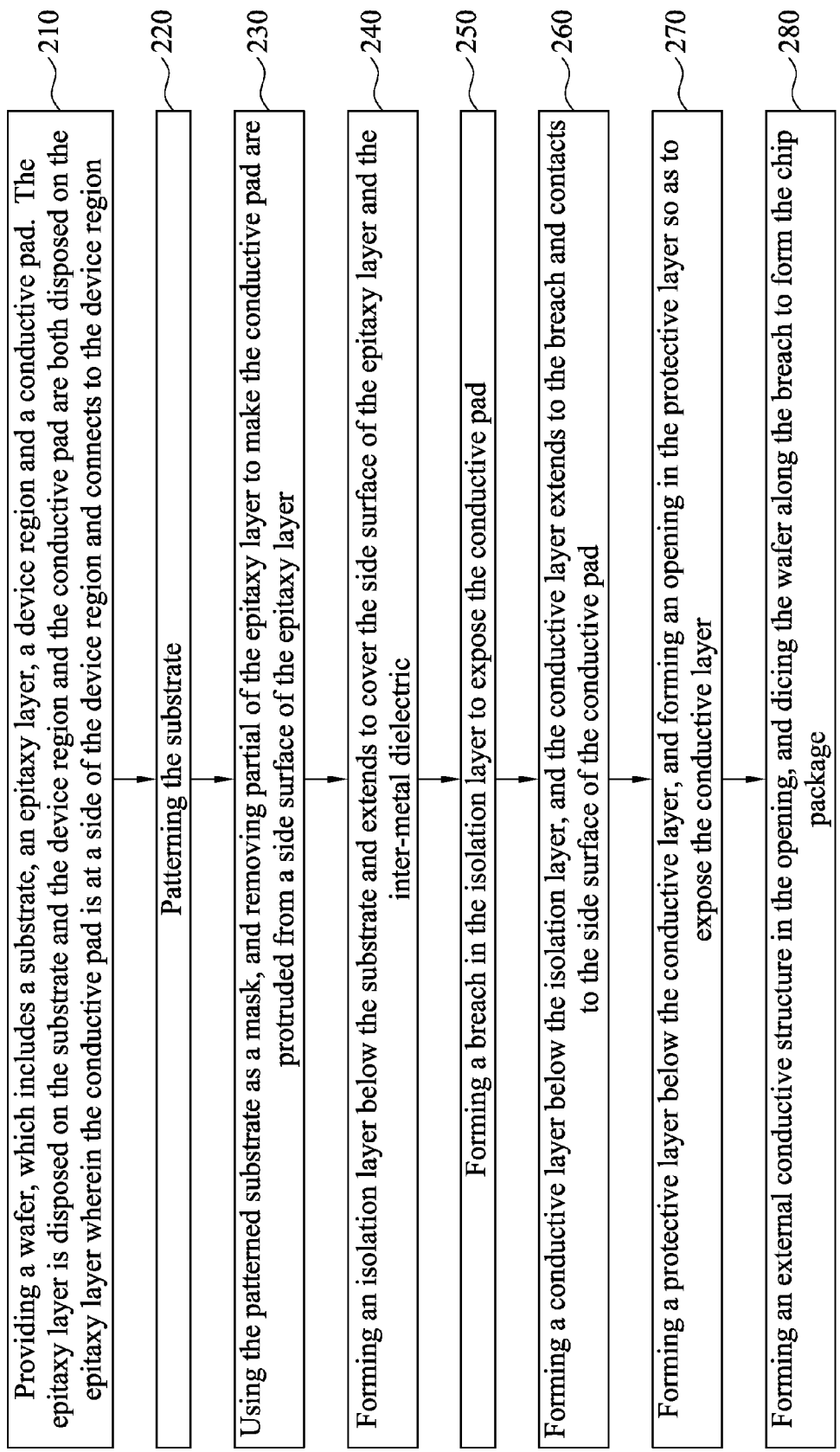
FIG. 2 illustrates a flow chart of a method of manufacturing the chip package, in accordance with various embodiments.

Referring to FIG. 2, it shows a flow chart illustrating a method of manufacturing the chip package, in accordance with various embodiments. The method of manufacturing the chip package may be further understood with reference to FIGS. 3A to 3H. FIGS. 3A to 3H are cross-sectional views illustrating various process stages of manufacturing the chip package depicted in FIG. 2.

Figure 3A:
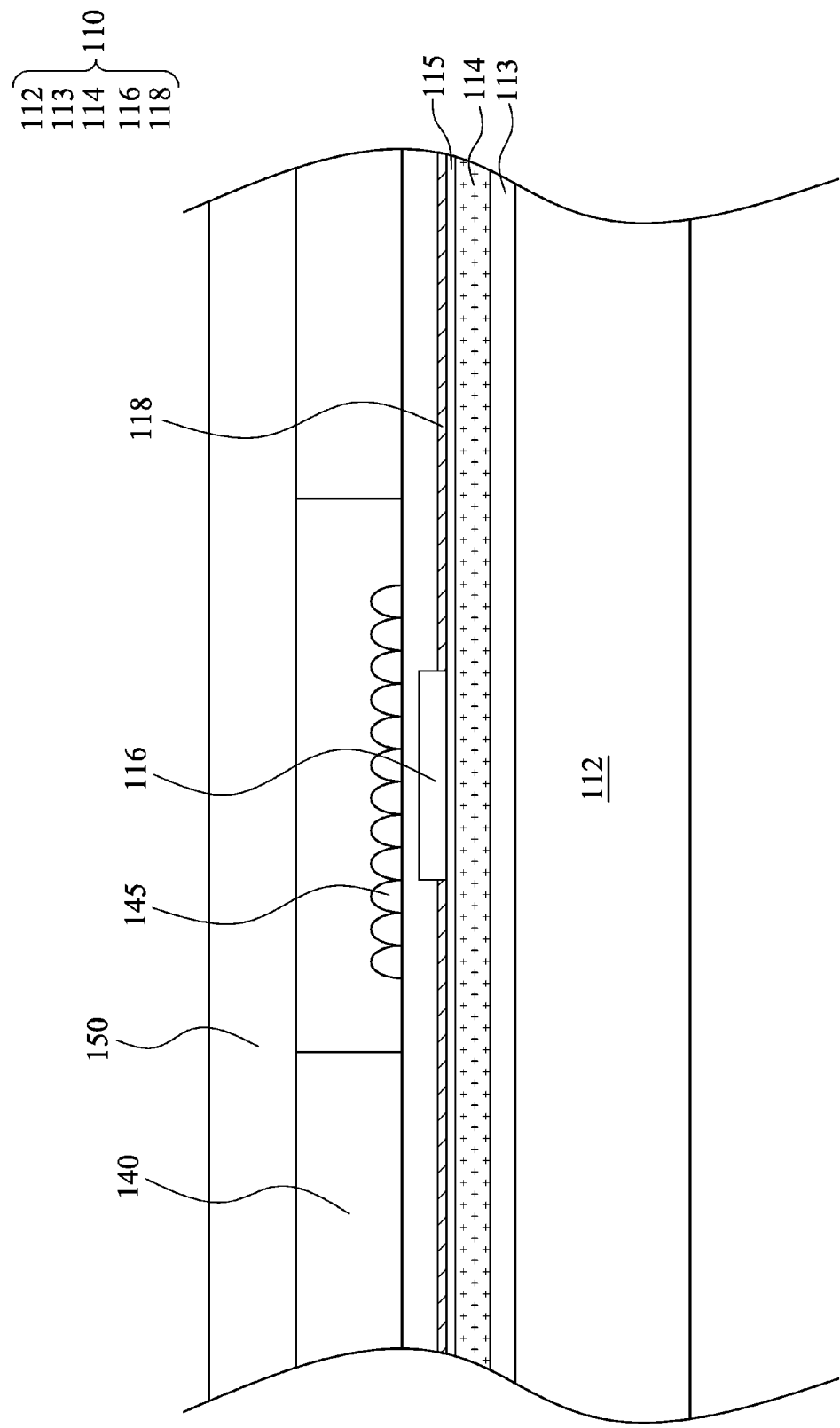
FIGS. 3A to 3H are cross-sectional views illustrating various process stages of manufacturing the chip package shown in FIG. 1A, in accordance with some embodiments.

With reference to step 210 and FIG. 3A, a wafer 300 is provided. The wafer 300 includes a substrate 112, an epitaxy layer 114, a device region 116 and a conductive pad 118. The epitaxy layer 114 is positioned over the substrate 112, and both the device region 116 and the conductive pad 118 are disposed on the epitaxy layer 114. The conductive pad 118 is positioned at a side of the device region 116 and is connected to the device region 116. Besides, the wafer 300 further includes a reflection layer 113 interposed between the substrate 112 and the epitaxy layer 114. Particularly, the wafer 300 has a plurality of chip regions, and these chip regions are diced to form a plurality of chips shown in FIG. 1A in a subsequent dicing process. As previously described in connection with FIG. 1A, one or more metal layers, in the interconnect metal structure of the device region 116 in the wafer 300, are connected with the semiconductor devices of device region 116, and further extend out to serve as the conductive pad 118. In addition, the inter-metal dielectric layer 115 is positioned between the epitaxy layer 114 and the conductive pad 118. In other embodiments, the wafer 300 further includes a sensing device 145 positioned above the device region 116 and substantially corresponding to the device region 116. In addition, a spacer 140 is formed to surround the sensing device 145, and a transparent substrate 150 is formed above the spacer 140 and covers the sensing device 145.

Figure 3B:
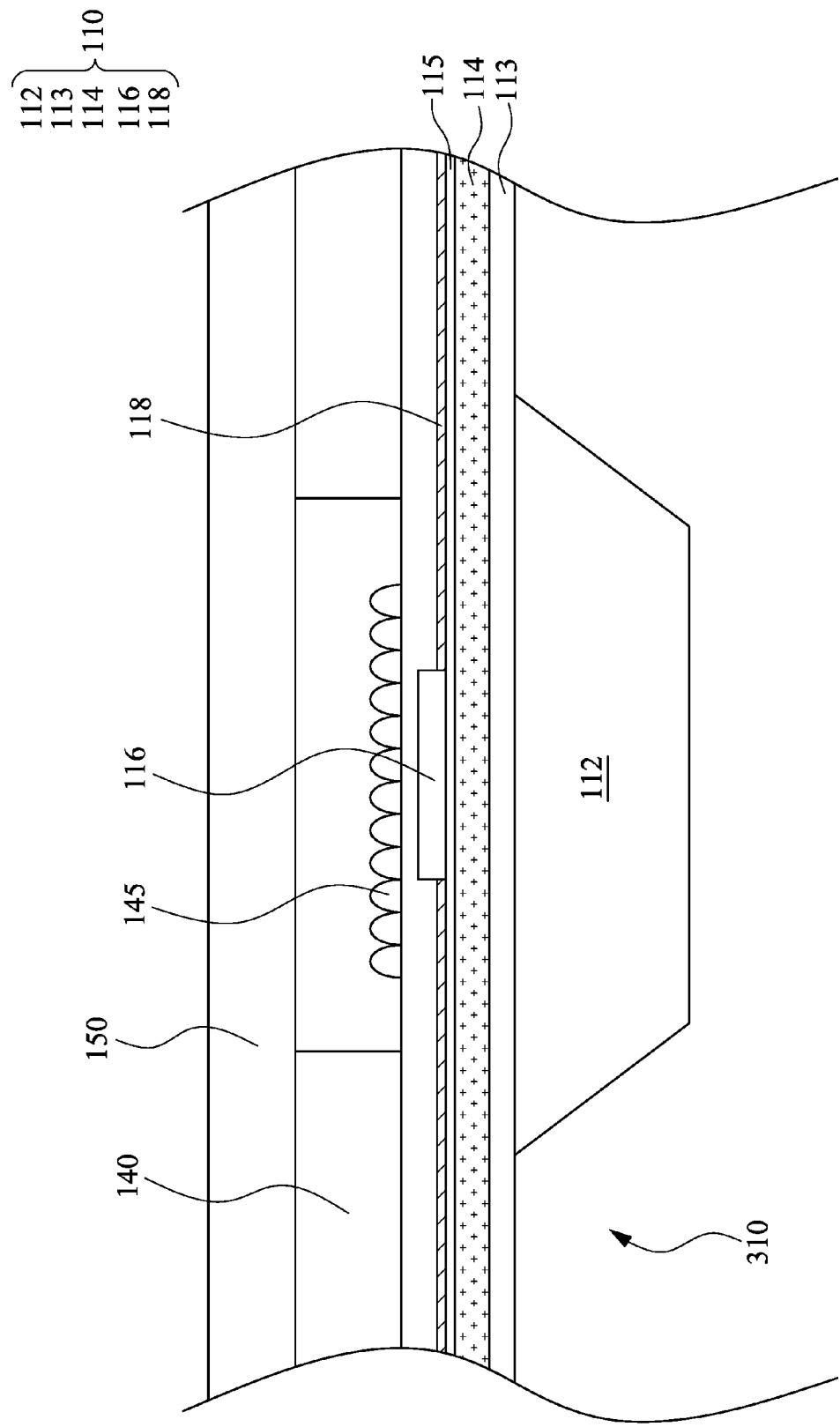

With reference to step 220 and FIG. 3B, the substrate 112 is patterned. In this step, a portion of the substrate 112 is removed by a photolithography-etching approach to form a recess 310 exposing the reflection layer 113. Particular steps of photolithography-etching include forming a photoresist layer covering the substrate 112, and exposing the photoresist layer by using a mask with a predetermined pattern so as to transfer the predetermined pattern onto the photoresist layer. After removing the mask, the substrate 112 where is not protected by the photoresist layer is etched by a suitable solvent or a plasma gas until the reflection layer 113 is revealed.

Figure 3C:
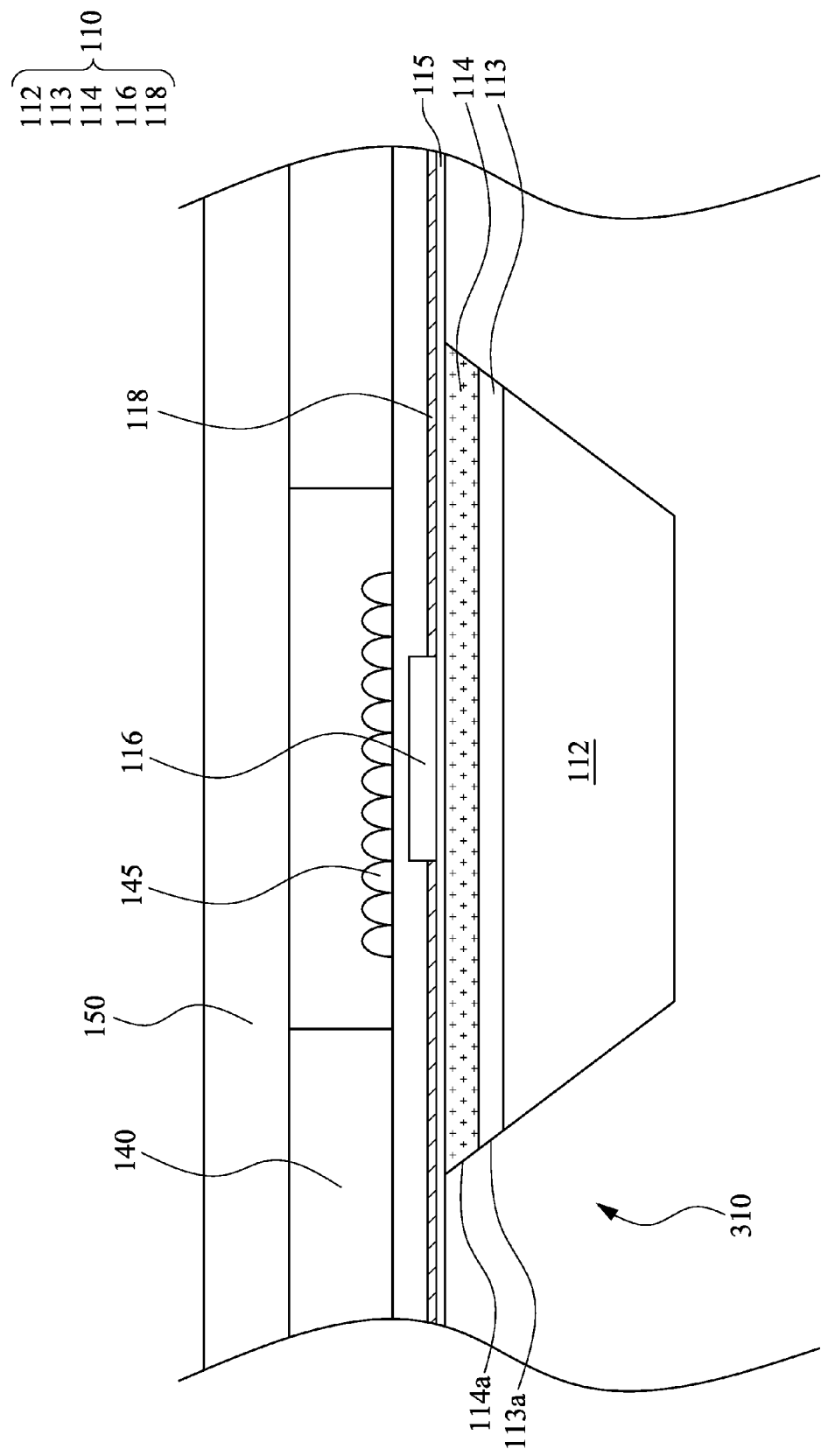

Referring to step 230 and FIG. 3C, a portion of the epitaxy layer 114 is removed using the patterned substrate 112 as a mask such that the inter-metal dielectric layer 115 and the conductive pad 118 protrudes out of the side surface 114a of the epitaxy layer 114. Without using extra photoresist layer in this step, the exposed portion of the reflective layer 113 is directly etched using the patterned substrate 112 as a mask to expose the epitaxy layer 114 below the reflective layer 113. Thereafter, the etching process continues to etch the exposed portion of the epitaxy layer 114, and the condition of the etching process is controlled to stop at the surface of the inter-metal dielectric layer 115 Specifically, the etching firstly removes a portion of the reflection layer 113 so to expose the side surface 113a thereof through the recess 310, and then continuously removes a portion of the epitaxy layer 114 to expose the side surface 114a thereof in the recess 310, and stops at the surface of the inter-metal dielectric layer 115. Accordingly, the conductive pad 118 may protrude out of the side surface 114a of the epitaxy layer 114 because it is not etched in this step. It is noted that the solvent or plasma gas used in this step has a high selectivity with respect to the reflective layer 113 and the epitaxy layer 114, and therefore the removal of the substrate 112 may be prevented in the etching process, and the remained substrate 112 can be kept.

Figure 3D:
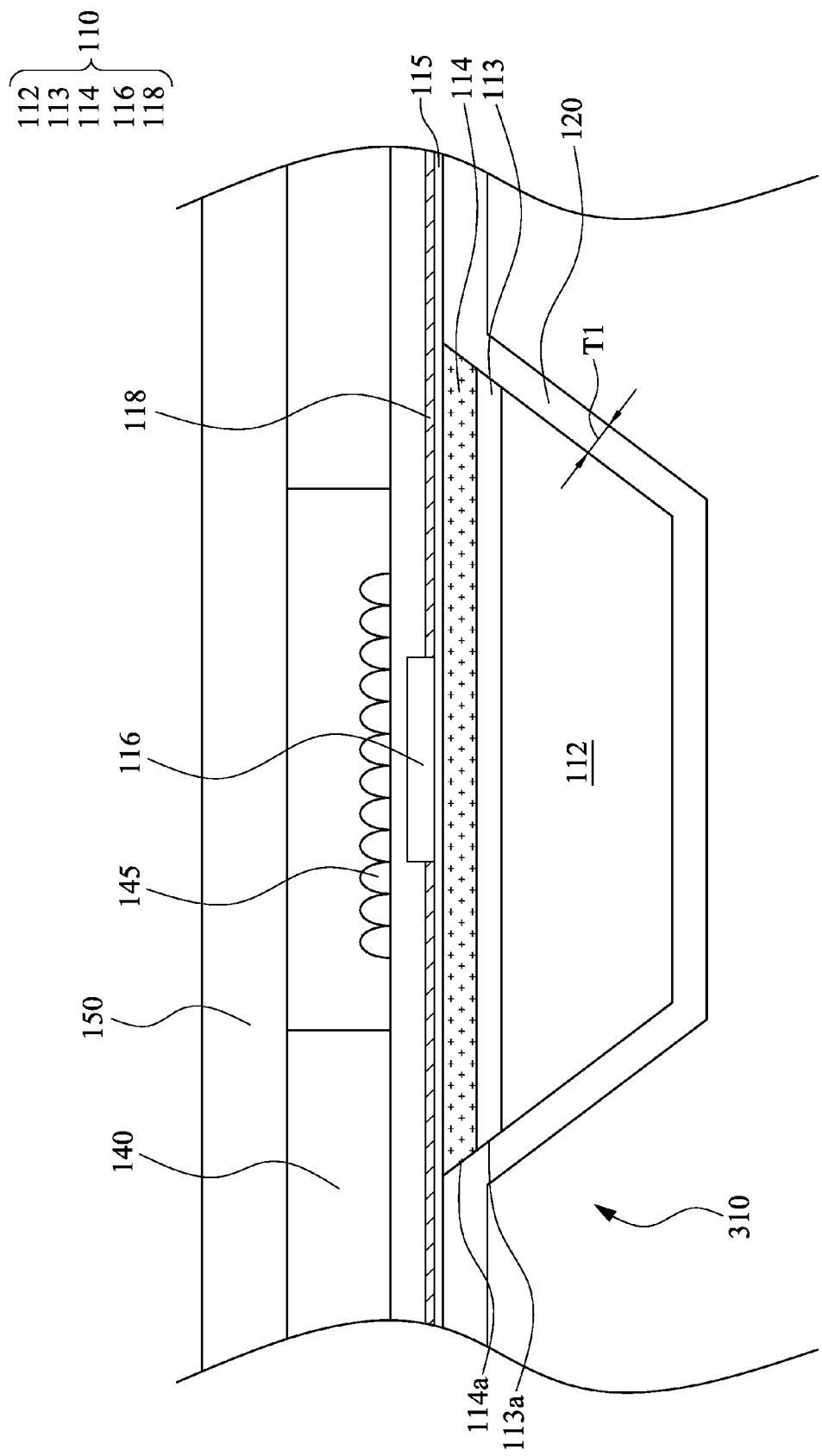

With reference to step 240 and FIG. 3D, an insulating layer 120 is formed below the substrate 112, and the insulating layer 120 extends to cover the side surface 114a of the epitaxy layer 114 and the inter-metal dielectric layer 115. In this step, polymeric material is used to cover the substrate 112. Since the polymeric material has fluidity, it may flow along the substrate 112 and cover the substrate 112, the side surface 113a of the reflective layer 113, the side surface 114a of the epitaxy layer 114, and the surface of the inter-metal dielectric layer 115. In some embodiments, the polymeric material is a photosensitive epoxy, and an exposure is performed thereon. Therefore, the polymeric material is cross-linked and cured to form the insulating layer 120. In yet some embodiments, the approach of forming the insulating layer 120 includes a spin coating process a printing process, or other suitable deposition approaches, for example.

It is noted that the thickness T1 of the insulating layer 120 at the side surface 114a of the epitaxy layer 114 dominates the distance between the conductive layer 130 and the epitaxy layer 114. Therefore, the thickness T1 at the side surface of the insulating layer 120 is managed to make sure the electrical insulation between the epitaxy layer 114 and the conductive layer 130. In some embodiments, the thickness T1 at the side surface of the insulating layer 120 is greater than 6 micrometer, preferably between 6 and 10 micrometer.

Figure 3E:
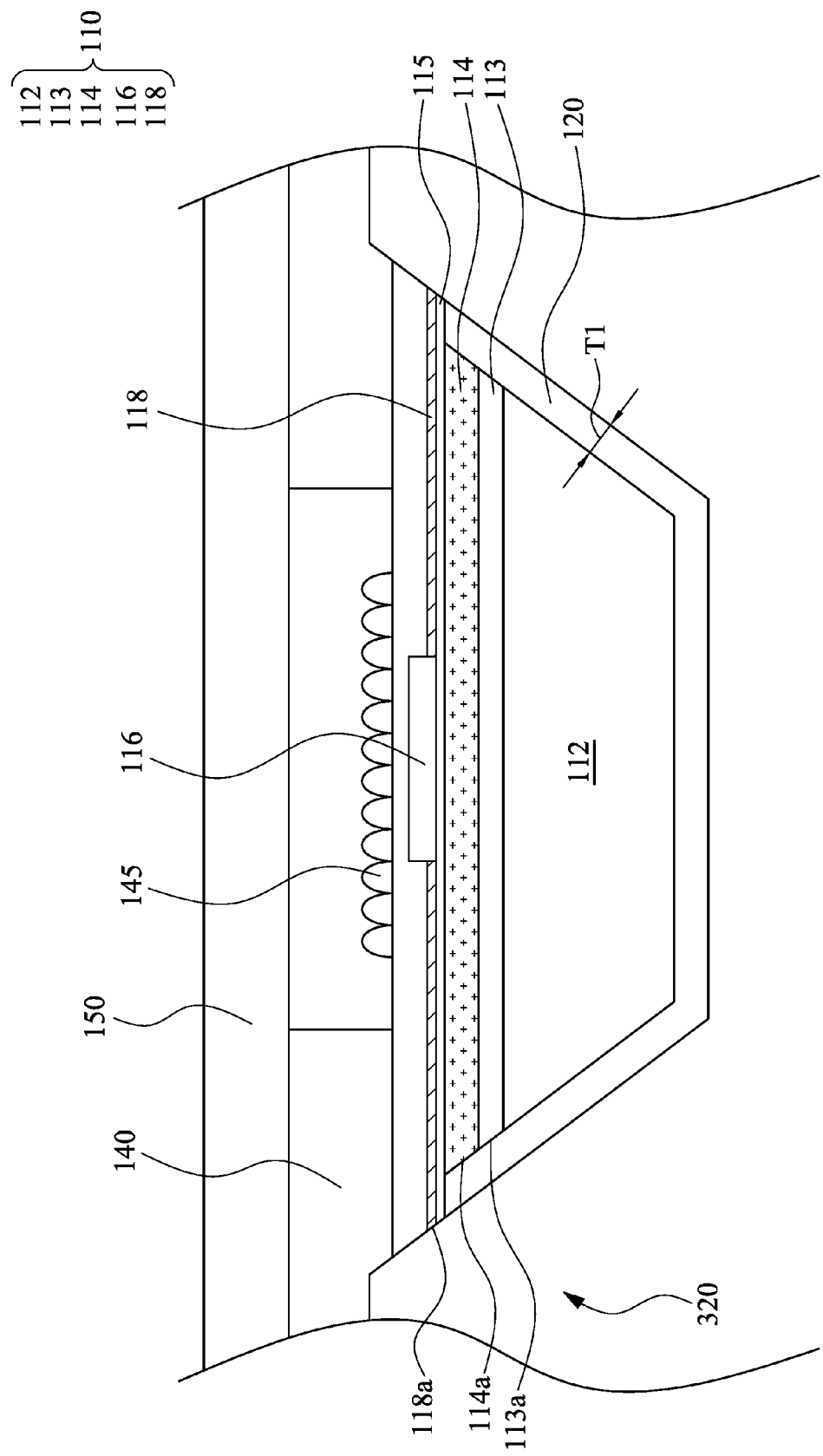

With reference to step 250 and FIG. 3E, a notch 320 is formed in the insulating layer 120 so to expose the conductive pad 118. In this step, a knife is used to cut off a portion of the insulating layer 120, a portion of the conductive pad 118, and a portion of the spacer 1 to form the notch 320 exposing the side surface 118a of the conductive pad 118.

Figure 3F:
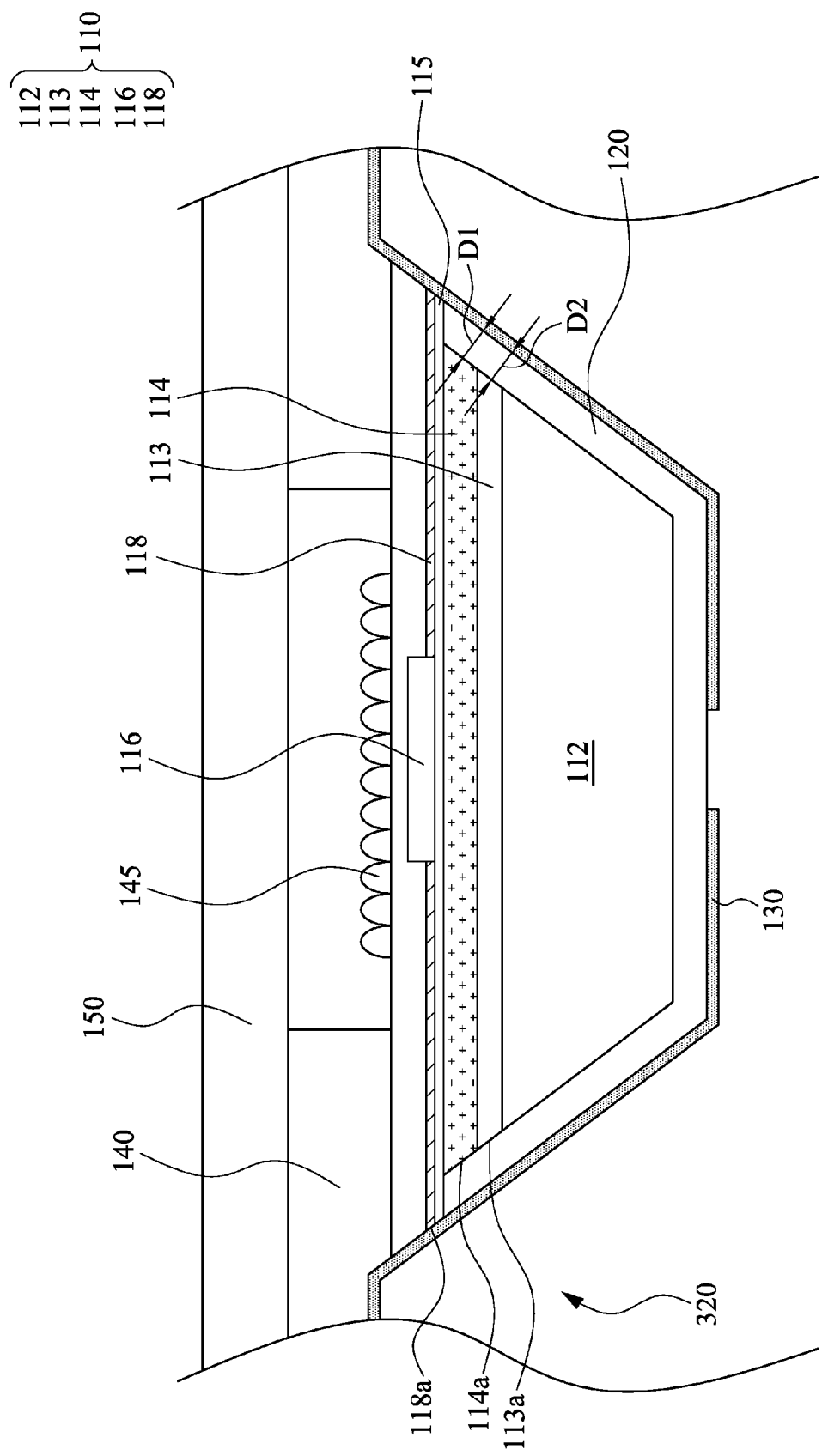

With reference to step 260 and FIG. 3F, a conductive layer 130 is formed below the insulating layer 120, and the conductive layer 130 is extended to the notch 320 and in contact with the side surface 118a of the conductive pad 118. A layer of conductive material may be deposited, for example, by sputtering techniques, evaporating techniques, electroplating techniques, or electroless plating, and then a photolithography-etching process is carried out to pattern the deposited conductive material layer, thereby forming the conductive layer 130. As mentioned hereinbefore, the thickness T1 of the insulating layer 120 at the side surface 114a of the epitaxy layer 114 allows that the side surface 114a and the conductive layer 130 are separated by a first distance D1 to avoid incorrect electrical connections and short circuit between the conductive layer 130 and the epitaxy layer 114, in which the thickness T1 is substantially the same as the first distance D1. In some embodiments, the side surface 113a of the reflective layer 113 and the conductive layer 130 are separated by a second distance D2 which is substantially equal to the first distance D1. In addition, a knife cutting process is used to form the notch 320 exposing the conductive pad 118, so that the cost may be decreased since the removal of the insulating layer 120 using complicated photolithography process is not required. In some embodiments, materials of the conductive layer 560, for example, includes aluminum, copper, nickel or other suitable conductive materials.

Figure 3G:
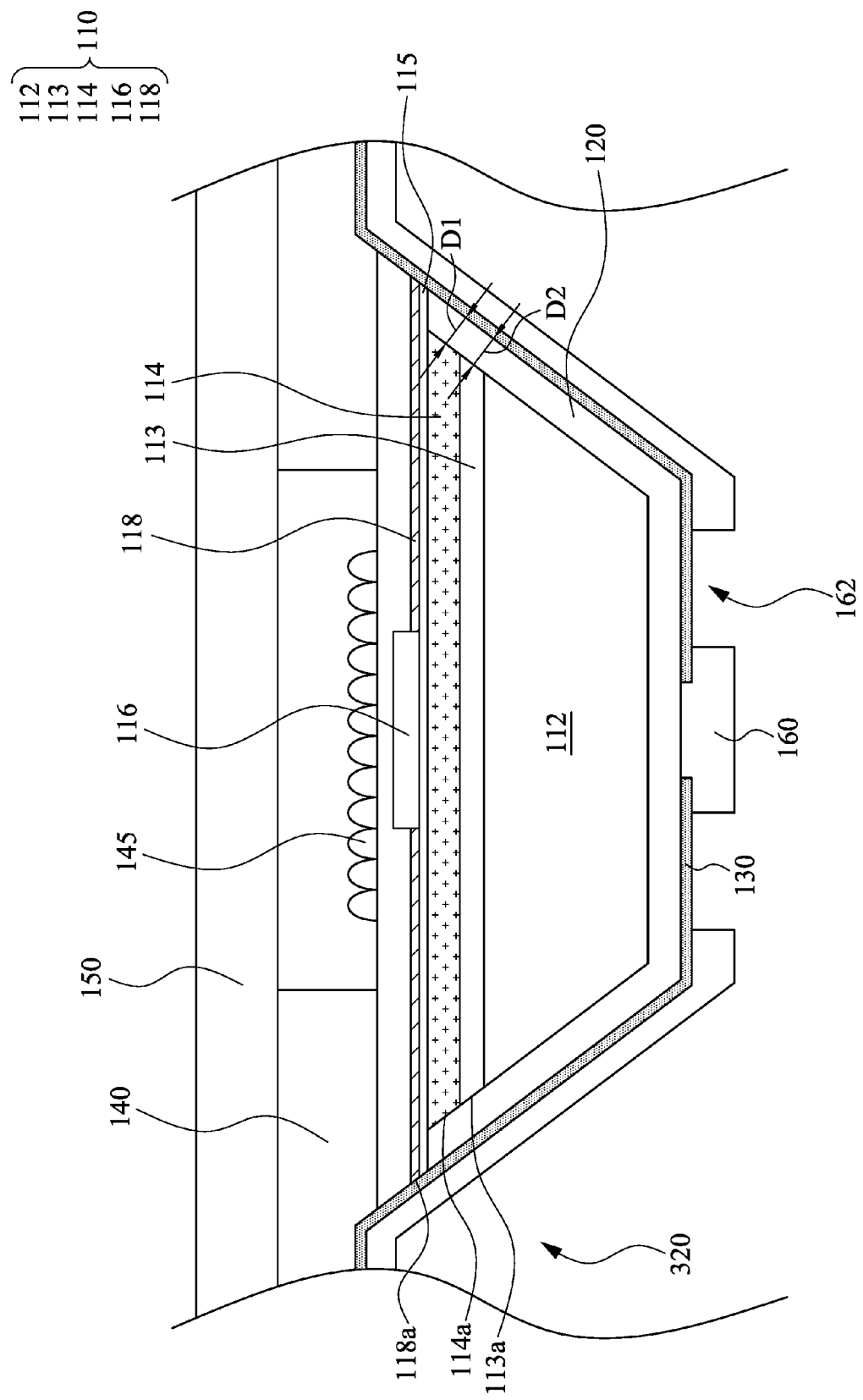

With reference to step 270 and FIG. 3G, a protective layer 160 is formed below the conductive layer 130, and an opening 162 is formed in the protective layer 160 so as to expose the conductive layer 130. The protective layer 160 may be formed to cover the conductive layer 130 by a process of brush-coating an epoxy material under the conductive layer 130. Subsequently, the protective layer 160 is pattered to form the opening 162 so to expose a portion of the conductive layer 130 from the opening 162 of the protective layer 160. In this example, the material of the protective layer 160 is a photosensitive epoxy, and therefore the protective layer 160 may be patterned directly by a photolithography process, and no additional photoresist layer is required for defining the pattern of the protective layer 160. In some embodiments, the material of the protective layer 160 is the same as that of the insulating layer 120, but the present disclosure is not limited thereto.

Figure 3H:
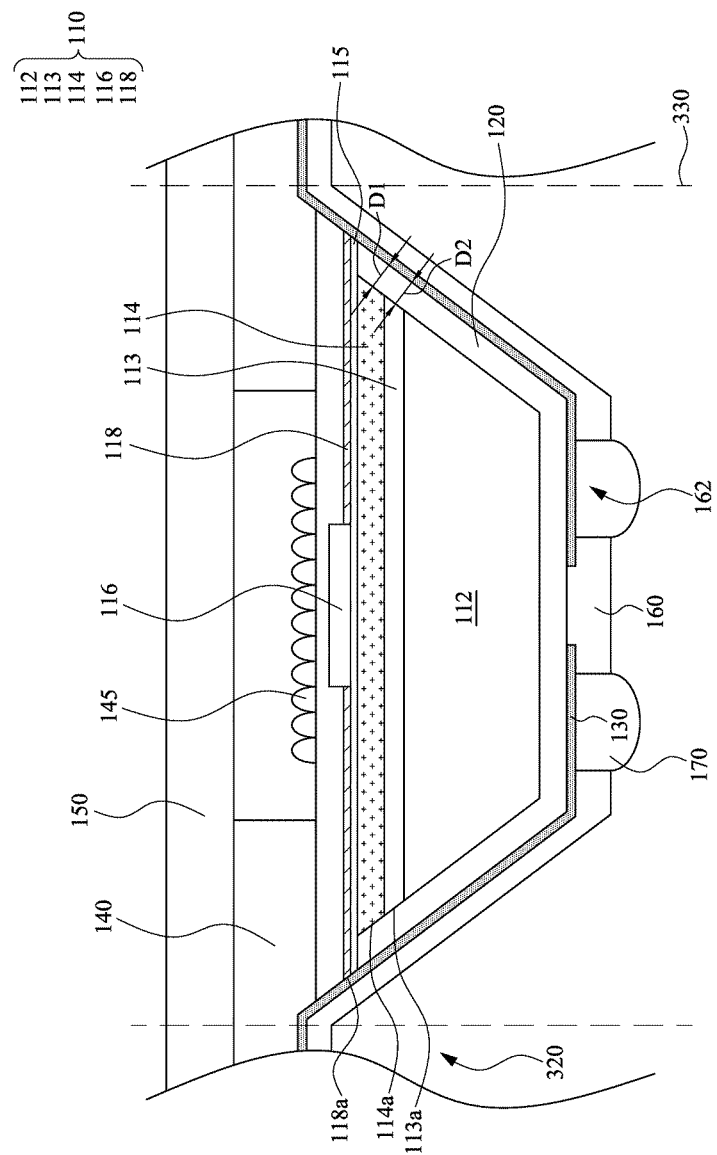

Referring to step 290 and FIG. 3H, an external conductive structure 170 is formed in the opening 162, and the wafer 300 is cut along the notch 320 to form the chip package 100 in FIG. 1A. The external conductive structure 170 may be a solder ball, a bump, or other structures known in the industry, and the external conductive structure 170 may be spherical, oval, square or rectangular in shape, but not limited thereto. After forming the external conductive structure 170, the protective layer 160, the conductive layer 130, the spacer 140 and the transparent substrate 150 are cut along a scribe line 330 in the notch 320 to separate these chip regions of the wafer 300, thereby forming a number of individual chip packages. In this example, the scribe line 330 is located within the notch 320.

Figure 4A:
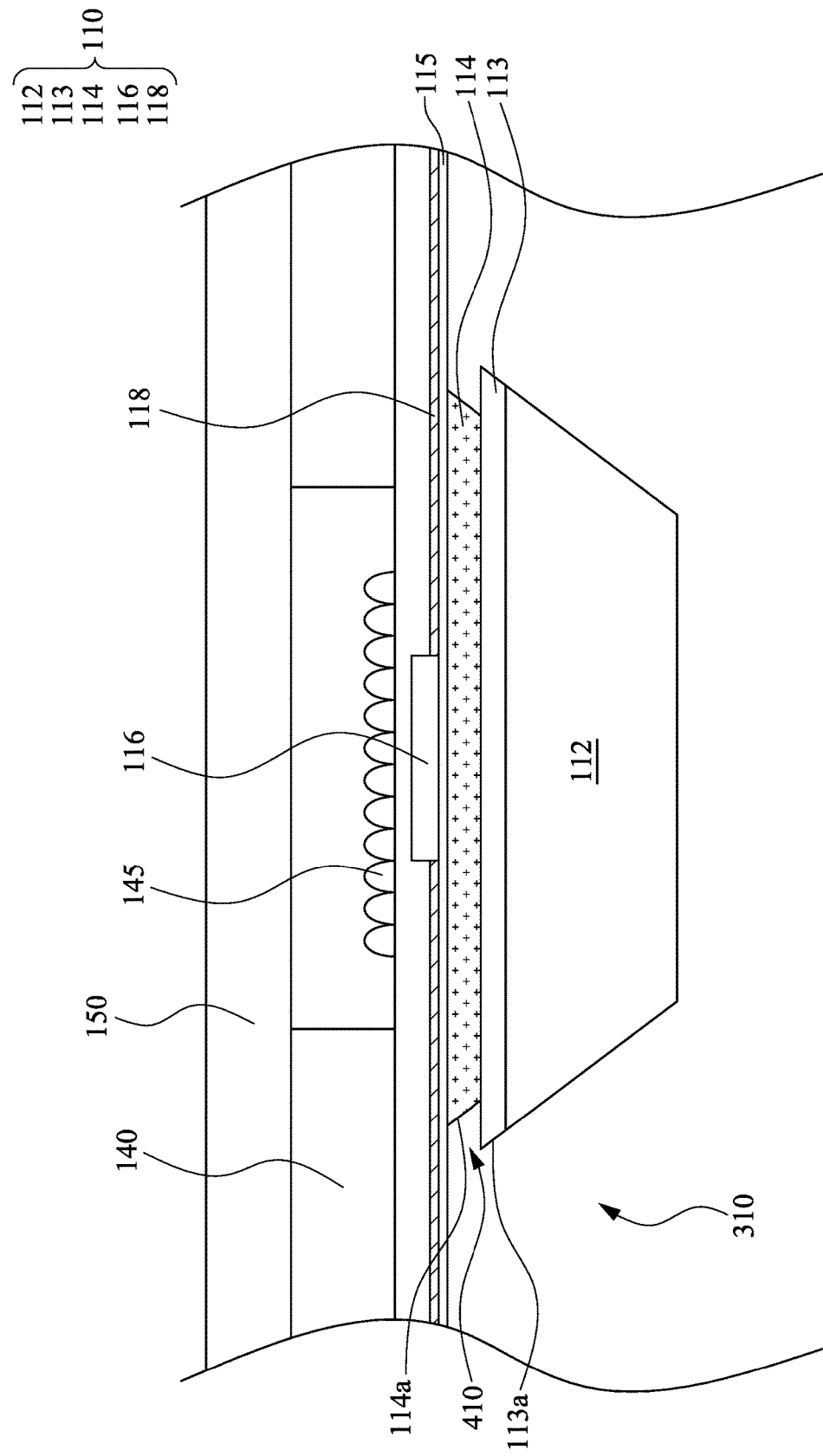
FIG. 4A to 4B are cross-sectional views illustrating the chip package at intermediate stages of manufacture, in accordance with some embodiments of the present disclosure.
Figure 4B:
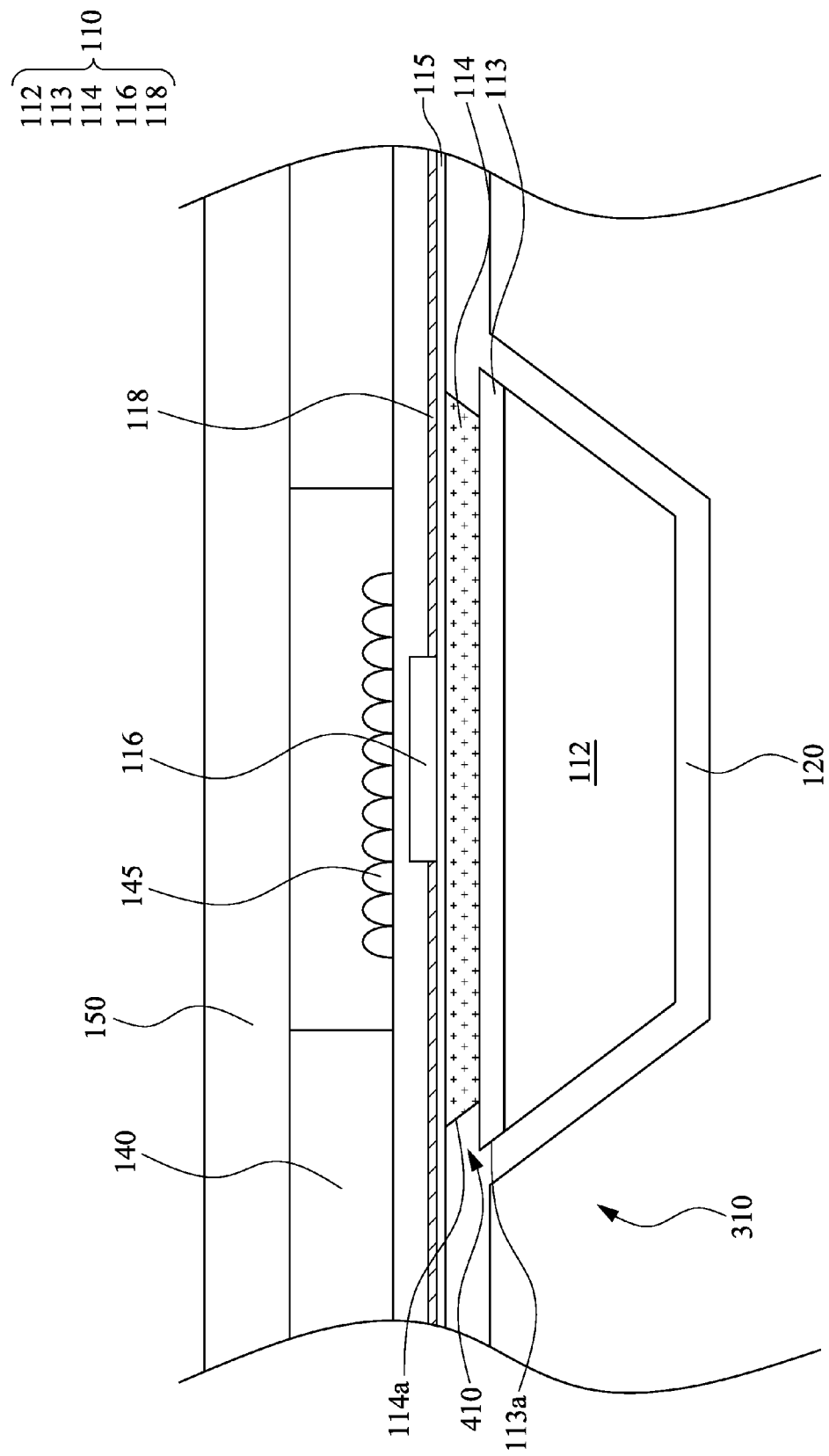

Referring to FIG. 4A and FIG. 4B, FIG. 4A and 4B are cross-sectional views illustrating intermediate stages in a method for manufacturing a chip package, in accordance with some embodiments of the present disclosure. FIG. 4A illustrates a process stage after the process stage shown in FIG. 3C hereinbefore. As shown in FIG. 4A, the side surface 114a of the epitaxy layer 114 is further laterally etched after the removal of the portions of the epitaxy layer 114 and reflective layer 113. As shown in FIG. 3C, the side surface 114*a* of the epitaxy layer 114 are initially coplanar with the side surface 113*a* of the reflective layer 113 such that the first distance D1 substantially equals the second distance D2. In order to further increase the first distance D1 and to enhance the insulation of the epitaxy layer 114 from the conductive layer 130, the side surface 114*a* of the epitaxy layer 114 is recessed with respect to the side surface 113*a* of the reflective layer 113 so to form a recess 410, as shown in FIG. 4A. Therefore, it may increase the first distance D1 between the side surface 114*a* of the epitaxy layer 114 and the conductive layer formed subsequently. Further, a sufficient portion of the reflective layer 113 may be retained in the chip package such that the optical conversion efficiency of chip package can be maintained.

In some embodiments, the lateral etching has a relatively high etching selectivity for the epitaxy layer 114. In other words, the solvent or plasma used in the etching has a high etching rate for the epitaxy layer 114 with respect to both of the reflective layer 113 and the inter-metal dielectric layer 115.

Referring to FIG. 4B, an insulating layer 120 is formed below the substrate 112, and the insulating layer 120 is extended to cover the side surface 114*a* of the epitaxy layer 114 and the surface of the inter-metal dielectric layer 115. As described hereinbefore in connection with FIG. 3D, the polymeric material of the insulating layer 120 may cover the substrate 112, the side surface 113*a* of the reflective layer 113, the side surface 114*a* of the epitaxy layer 114, and the surface of the inter-metal dielectric layer 115, and further flows in and fills the recess 410 because of its fluidity. The approach of forming the insulating layer 120 may refer to these described hereinbefore in connection with FIG. 3D, and the details are not repeated herein. After completing the step illustrated in FIG. 4B, the method may continue to perform the process steps shown in FIG. 3E, FIG. 3F, FIG. 3G and FIG. 3H, and eventually individual chip packages are formed. In the embodiments shown in FIG. 4A and FIG. 4B, the first distance D1 between the side surface 114*a* of the epitaxy layer 114 and the conductive layer 130 is further increased such that the first distance D1 is greater than the second distance D2 between the side surface 113*a* of the reflective layer 113 and the conductive layer 130.

As compared with conventional techniques, the epitaxy layer of the chip package, according to the present disclosure, is spaced apart from the conductive layer by a distance, and the epitaxy layer is not in contact with the conductive layer. An insulating layer is further disposed between the epitaxy layer and the conductive layer, and therefore the epitaxy layer is insulated from the conductive pad. Accordingly, the current can not be transmitted (input/output) between the conductive layer 130 and the epitaxy layer, and the short circuit there between is prevented. In addition, no additional photoresist layer is required to form the conductive layer protruding out of the side surface of the epitaxy layer, and thereby the manufacturing process and cost can be reduced. On the other hand, before the dicing process, the chip packages are manufactured in a wafer-level scale so that the manufacturing cost is lower than that of the conventional wire-bonding process. In another aspect, after the dicing process, the diced chip packages are chip-scale packages, and it is good for the miniaturized design.

While the present invention has been disclosed by way of embodiments hereinbefore, the present invention in not limited thereto, and it should be understood that one skilled in the art can make various changes and modifications without departing from the spirit and scope of this invention. The scope of the present invention is defined by the appended claims.

What is claimed is:

1. A chip package, comprising:
   a chip comprising:
      a substrate;
      an epitaxy layer positioned above the substrate;
      a device region positioned over the epitaxy layer, and
      a conductive pad positioned at a side of the device region and connected to the device region, wherein the conductive pad protrudes out of a side surface of the epitaxy layer;
   an insulating layer disposed below the substrate and extended to cover the side surface of the epitaxy layer, and
   a conductive layer disposed below the insulating layer and extended to contact the conductive pad, wherein the conductive layer and the side surface of the epitaxy layer are separated by a first distance.

2. The chip package of claim 1, wherein the first distance is greater than 6 micrometers.

3. The chip package of claim 2, wherein the first distance is between 6 and 10 micrometers.

4. The chip package of claim 1, wherein the thickness of the epitaxy layer is between 4 and 8 micrometers.

5. The chip package of claim 1, wherein the chip further comprises a reflection layer disposed between the substrate and the epitaxy layer.

6. The chip package of claim 5, wherein the conductive layer and the side surface of the reflective layer are separated by a second distance, and the first distance is greater than or equal to the second distance.

7. The chip package of claim 5, wherein a thickness of the reflection layer is between 1 and 2 micrometers.

8. The chip package of claim 1, further comprising:
   a protective layer covering the conductive layer and having an opening exposing the conductive layer, and
   an external conductive structure disposed in the opening and in contact with the conductive layer.

9. The chip package of claim 8, wherein the chip further comprises a sensing device positioned above the device region.

10. The chip package of claim 9, further comprising:
    a spacer surrounding the sensing device, and
    a transparent substrate disposed on the spacer and covering the sensing device.

11. A method of manufacturing a chip package, the method comprising:
    providing a wafer, the wafer comprising:
       a substrate;
       an epitaxy layer positioned above the substrate;
       a device region positioned over the epitaxy layer, and
       a conductive pad positioned at a side of the device region and connected to the device region;
    patterning the substrate;
    removing a portion of the epitaxy layer by using the patterned substrate as a mask such that the conductive pad protrudes out of a side surface of the epitaxy layer;
    forming an insulating layer below the substrate, the insulating layer extending to cover the side surface of the epitaxy layer and the conductive pad;
    forming a notch in the insulating layer to expose the conductive pad; and
    forming a conductive layer below the insulating layer, wherein the conductive layer extends to the notch and contacts the conductive pad.

12. The method of manufacturing the chip package of claim 11, wherein the wafer further comprises a reflection layer positioned between the substrate and the epitaxy layer.

13. The method of manufacturing the chip package of claim 12, wherein the step of removing the portion of the epitaxy layer further includes removing a portion of the reflection layer to expose a side surface of the reflection layer.

14. The method of manufacturing the chip package of claim 13, wherein the insulating layer is further extends to cover the side surface of the reflection layer.

15. The method of manufacturing the chip package of claim 11, further comprising laterally etching the side surface of the epitaxy layer, before forming the insulating layer.

16. The method of manufacturing the chip package of claim 11, wherein the wafer further comprises a sensing device on the device region.

17. The method of manufacturing the chip package of claim 16, further comprising:

forming a spacer surrounding the sensing device, and forming a transparent substrate above the spacer and covering the sensing device.

18. The method of manufacturing the chip package of claim 17, further comprising:

forming a protective layer below the conductive layer, and forming an opening in the protective layer to expose the conductive layer.

19. The method of manufacturing the chip package of claim 18, further comprising:

forming an external conductive structure in the opening to contact the conductive layer.

20. The method of manufacturing the chip package of claim 19, further comprising:

dicing the protective layer, the conductive layer, the spacer and the transparent substrate along the notch to form a chip package.

* * * * *